US008749077B2

(12) United States Patent
Wu et al.

(10) Patent No.: US 8,749,077 B2
(45) Date of Patent: Jun. 10, 2014

(54) THREE-DIMENSIONAL INTEGRATED CIRCUIT (3DIC)

(71) Applicant: Taiwan Semiconductor Manufacturing Company, Ltd., Hsin-Chu (TW)

(72) Inventors: Chih-Wei Wu, Zhuangwei Township (TW); Szu Wei Lu, Hsin-Chu (TW); Jing-Cheng Lin, Hsin-Chu (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/949,097

(22) Filed: Jul. 23, 2013

(65) Prior Publication Data

US 2013/0307149 A1 Nov. 21, 2013

Related U.S. Application Data

(62) Division of application No. 13/215,959, filed on Aug. 23, 2011, now Pat. No. 8,557,684.

(51) Int. Cl.
*H01L 25/065* (2006.01)
*H01L 27/07* (2006.01)
*H01L 33/48* (2010.01)
*H01L 21/301* (2006.01)

(52) U.S. Cl.
USPC ...... 257/792; 257/684; 257/725; 257/E25.01; 257/E25.023; 257/E27.07; 438/460; 438/462; 438/463

(58) Field of Classification Search
None
See application file for complete search history.

(56) References Cited

U.S. PATENT DOCUMENTS

| | | | |
|---|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |

(Continued)

*Primary Examiner* — Zandra Smith
*Assistant Examiner* — Pamela E Perkins
(74) *Attorney, Agent, or Firm* — Slater and Matsil, L.L.P.

(57) ABSTRACT

An embodiment 3DIC device includes a semiconductor chip, a die, and a polymer. The semiconductor chip includes a semiconductor substrate, wherein the semiconductor substrate comprises a first edge, and a low-k dielectric layer over the semiconductor substrate. The die is disposed over and bonded to the semiconductor chip. The polymer is molded onto the semiconductor chip and the die. The polymer includes a portion level with the low-k dielectric layer, wherein the portion of the polymer comprises a second edge vertically aligned to the first edge of the semiconductor substrate and a third edge contacting the low-k dielectric layer, wherein the second and the third edges are opposite edges of the portion of the polymer.

23 Claims, 7 Drawing Sheets

(56) References Cited

U.S. PATENT DOCUMENTS

| | | |
|---|---|---|
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,265,034 B2 | 9/2007 | Lu et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2005/0148160 A1* | 7/2005 | Farnworth et al. ............ 438/462 |
| 2006/0189099 A1* | 8/2006 | Lu et al. ........................ 438/460 |

* cited by examiner

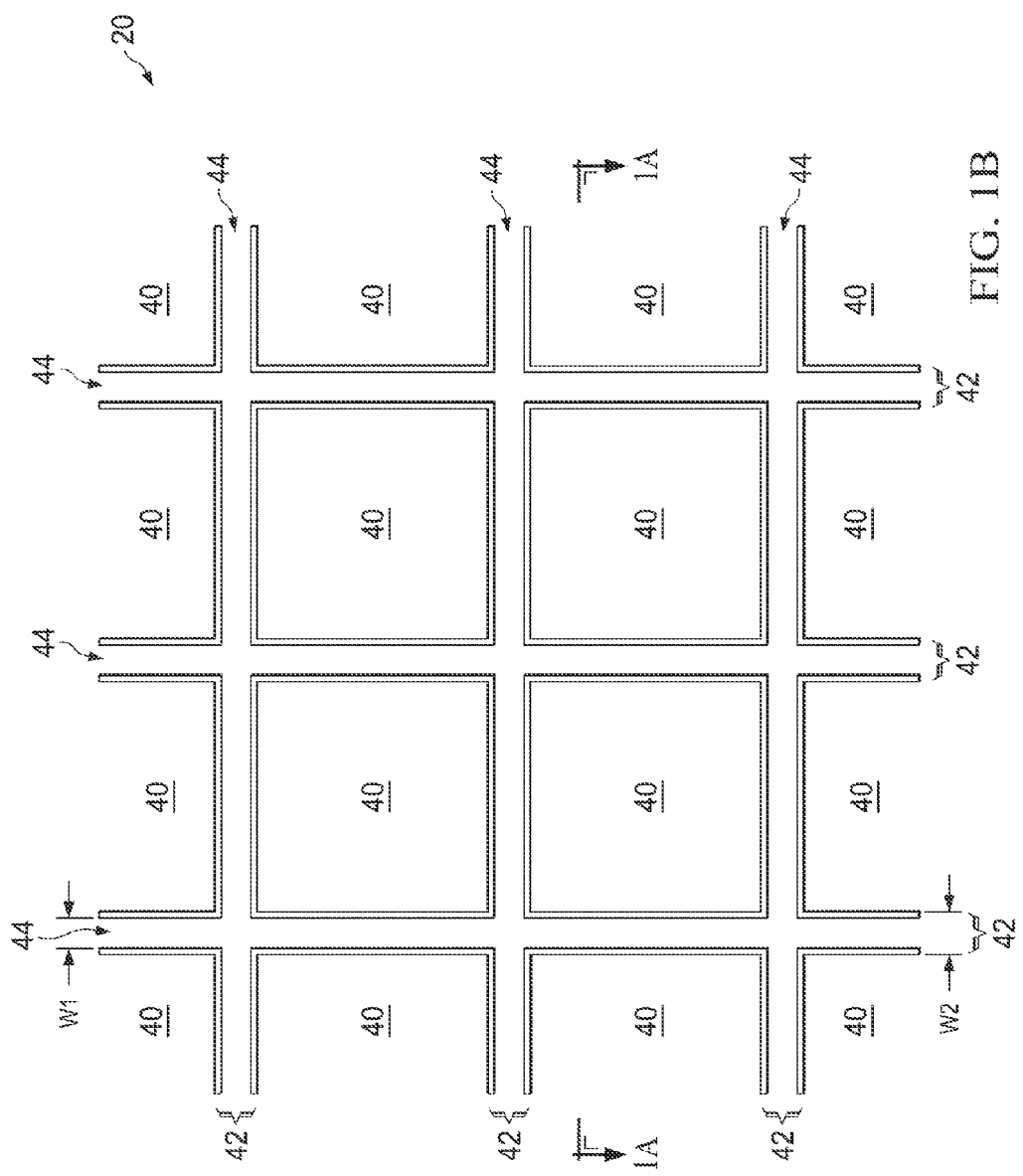

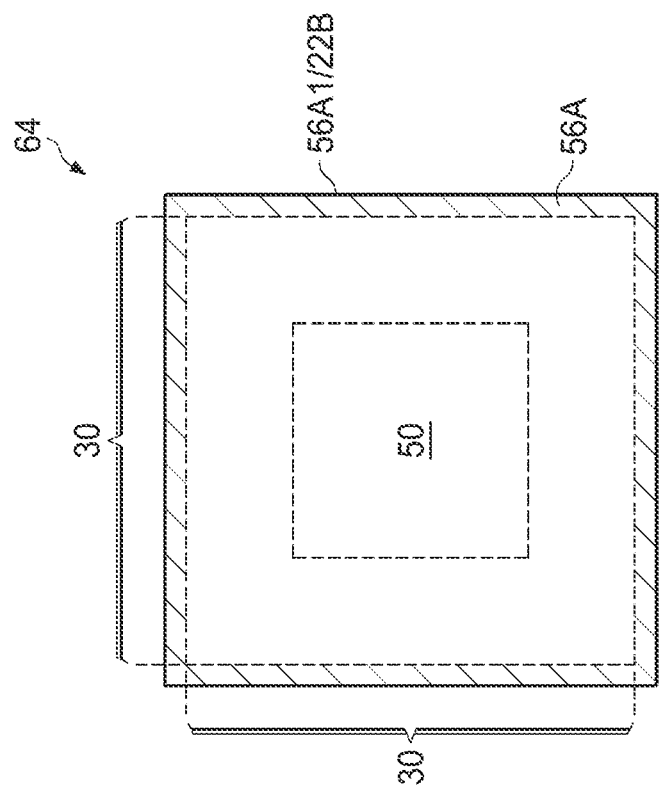

THREE-DIMENSIONAL INTEGRATED CIRCUIT (3DIC)

CROSS-REFERENCE TO RELATED APPLICATIONS

This application is a divisional of co-pending U.S. patent application Ser. No. 13/215,959, filed on Aug. 23, 2011, entitled "Three-Dimensional Integrated Circuit (3DIC) Formation Process," which application is hereby incorporated herein by reference.

BACKGROUND

In three-dimensional integrated circuit (3DIC) formation process, device dies may be bonded to a wafer. Typically, after the bonding of the dies onto the wafer, a molding compound is applied to encapsulate the device dies and the wafer. Solder bumps are formed on the wafer to electrically couple to the devices in the wafer. The electrical connection to the devices in the device dies and the devices in the wafer includes through-silicon vias (TSVs).

After the molding compound is applied, a die saw is performed to saw apart the wafer and the device dies into dies, wherein each of the dies may include one of the device dies and one of the chips in the wafer. The die saw is typically performed using a blade, which cuts through the scribe lines in the wafer. Since the wafer may include low-k dielectric materials, the mechanical stress applied by the blade may cause cracks. The cracks in the low-k dielectric materials may propagate to the chips in the wafer, resulting in yield loss. Accordingly, to reduce the yield loss, the process window for the blade dicing is limited.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 5A are cross-sectional views and a top view of intermediate stages in the formation of a three-dimensional integrated circuit (3DIC) package in accordance with various embodiments; and FIG. 5B illustrates a bottom view of the package formed using the process illustrated in FIGS. 1A through 5A.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of packaging integrated circuits is provided in accordance with various embodiments. The intermediate stages of forming a three-dimensional integrated circuit (3DIC) package in accordance with embodiments are illustrated. The variations of the embodiments are discussed. Throughout the various views and illustrative embodiments, like reference numbers are used to designate like elements.

Figure 1A:
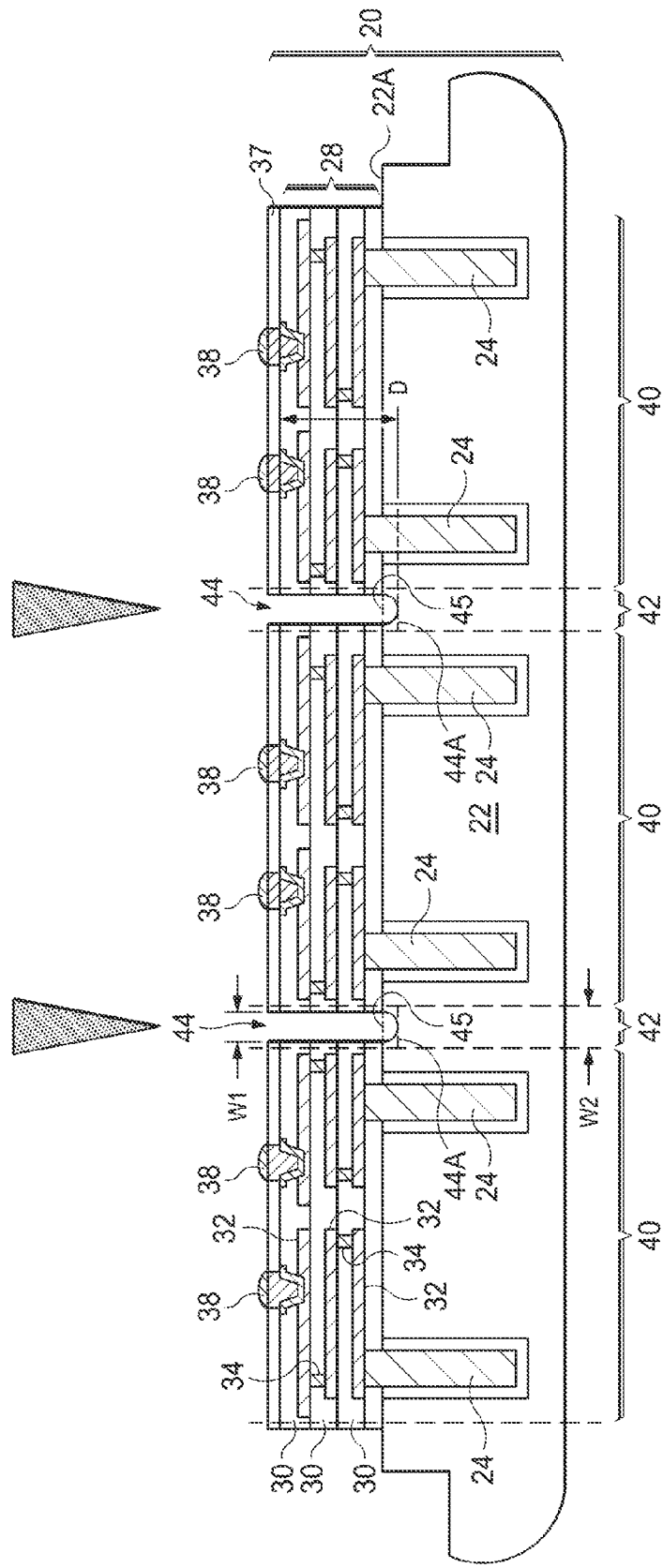

FIG. 1A illustrates a cross-sectional view of wafer 20. Wafer 20 may include semiconductor substrate 22. In an embodiment, semiconductor substrate 22 is a crystalline silicon substrate, although it may comprise other semiconductor materials such as silicon germanium, silicon carbon, or the like. Integrated circuit devices such as transistors (not shown) may be formed at surface 22A of semiconductor substrate 22. Through-substrate vias (TSVs, also sometimes referred as through-silicon vias) 24 extend from top surface 22A of semiconductor substrate 22 into semiconductor substrate 22.

Interconnect structure 28 is formed over semiconductor substrate 22, and is used to electrically connect to the integrated circuit devices. Interconnect structure 28 may include a plurality of dielectrics layers 30, which may include inter-layer dielectric (ILD) and inter-metal dielectric (IMDs). Metal lines 32 are formed in dielectric layers 30, wherein the metal lines 32 that are in a same dielectric layer 30 are in combination referred to as a metal layer. Vias 34 are formed between, and interconnecting, metal lines 32 in different metal layers. In an embodiment, dielectric layers 30 comprise at least one, and possibly a plurality of, low-k dielectric layer(s) having low k values. The k values of the low-k dielectric materials in dielectric layers 30 may be lower than about 3.0, or lower than about 2.5, for example. In an embodiment, passivation layer(s) 37 are formed over low-k dielectric layers 30. Additional layers such as polyimide layers (not shown), post-passivation interconnects (PPIs, not shown), may also be formed.

Metal bumps 38 are formed at the surface of wafer 20. In an embodiment, metal bumps 38 are copper bumps. In alternative embodiments, metal bumps 38 are solder bumps, or composite bumps comprising copper posts, nickel layers, solder caps, and/or the like. Wafer 20 includes a plurality of chips 40, which may be identical to each other, and a plurality of scribe lines 42 between neighboring chips 40.

A laser grooving is performed on wafer 20 to form trenches 44. Trenches 44 are in scribe lines 42. Depth D of trenches 44 may be between about 5 μm and about 15 μm, although different depths may also be adopted, depending on the thickness of dielectric layers 30 and 37. Width W1 of trenches 44 may be between about 10 μm and about 100 μm. Width W1 of trenches 44 is also smaller than width W2 of scribe lines 42. In an embodiment, all low-k dielectric layers, which may include layers 30, in wafer 20 are grooved, and trenches 44 penetrates all low-k dielectric layers that are over semiconductor substrate 22. Bottoms 44A of trenches 44 at least reach the top surface of a non-low-k dielectric layer that is underlying all low-k dielectric layers. In an exemplary embodiment, bottoms 44A is level with, and may be lower than, the top surface of a contact etch stop layer (CESL, not shown). In alternative embodiments, bottoms 44A of trenches 44 are level with, or lower than, top surface 22A of semiconductor substrate 22. Accordingly, semiconductor substrate 22 may be exposed through trenches 44. Dashed lines 45 represent the bottoms of trenches 44 that are level with top surface 22A of semiconductor substrate 22.

FIG. 1B illustrates a top view of the structure shown in FIG. 1A, wherein the cross-sectional view in FIG. 1A is obtained from the plane crossing line 1A-1A in FIG. 1B. In the top view, trenches 44 may form a grid pattern, with chips 40 located in the grids. Furthermore, trenches 44 may be formed in middle lines of scribe lines 42, with un-grooved portions of scribe lines 42 separating trenches 44 from chips 40.

Figure 2:
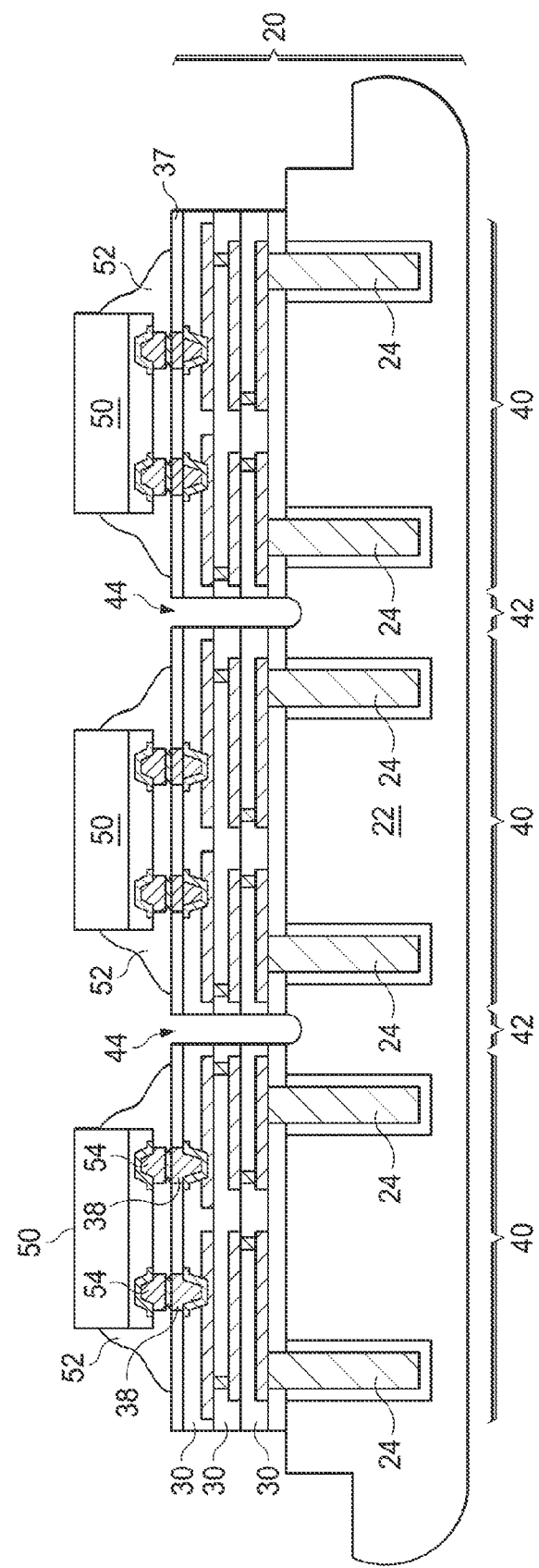

Referring to FIG. 2, dies 50 are bonded to chips 40 of wafer 20. In an embodiment, dies 50 are bonded to chips 40 through flip-chip bonding, although a wire bonding may also be used. Metal bumps 54 of dies 50 may be bonded to metal bumps 38 of wafer 20. Dies 50 may be device dies comprising logic circuits, memory dies, or the like, or may be packages includes a die bonded to an interposer, a package substrate, and/or the like. Underfill 52 is dispensed into the space between dies 50 and wafer 20. Underfill 52 is then cured. It is noted the order of the step shown in FIG. 1A and the step shown in FIG. 2 may be reversed, and the step of laser grooving may be performed after the step of bonding dies 50, and possibly the step of dispensing and curing underfill 52.

Figure 3:
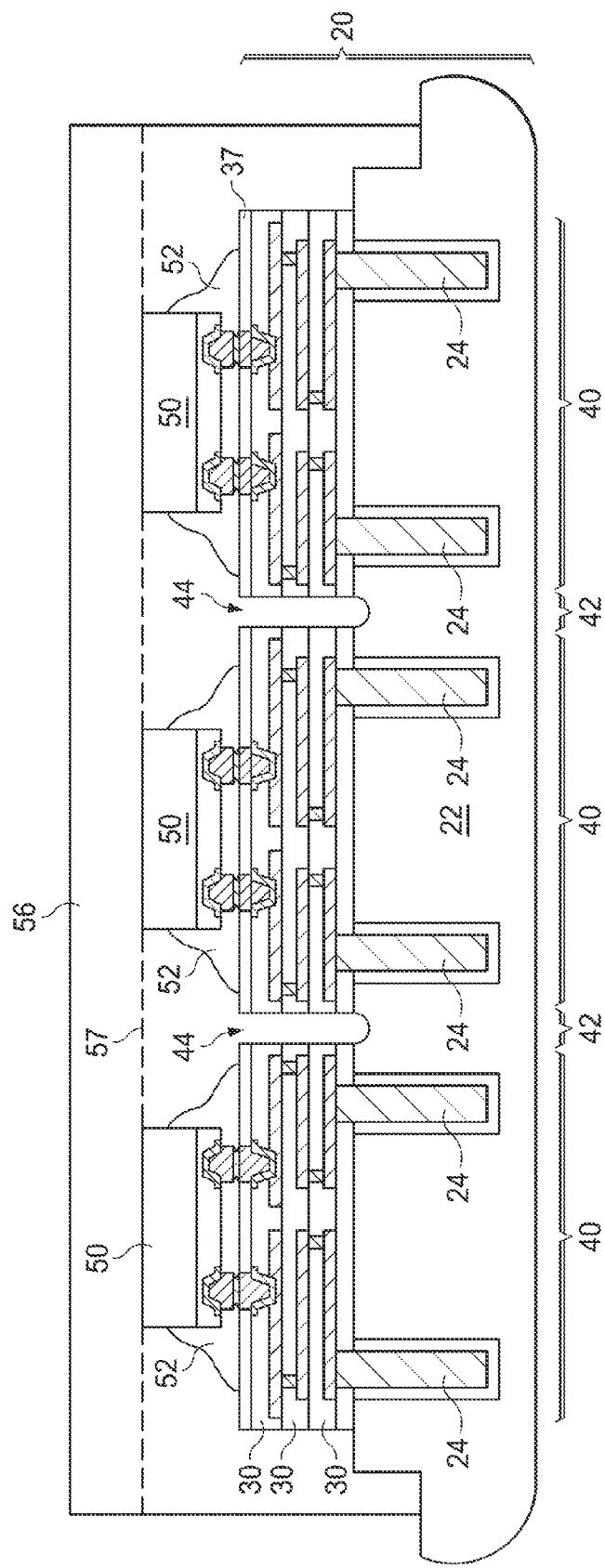

Next, as shown in FIG. 3, polymer 56 is molded on dies 50 and wafer 20. In an embodiment, polymer 56 is a molding compound, an epoxy, or the like. Polymer 56 comprises first portions filling into trenches 44, second portions filling the gaps between neighboring dies 50, and third portions over dies 50. Polymer 56 is then cured. In an embodiment, after the curing of polymer 56, a planarization step, such as a grinding, is performed to level the top surface of polymer 56. The top surface of remaining portion of polymer 56 may be higher than, or level with (as indicated by dashed line 57), the top surfaces of dies 50.

Figure 4:
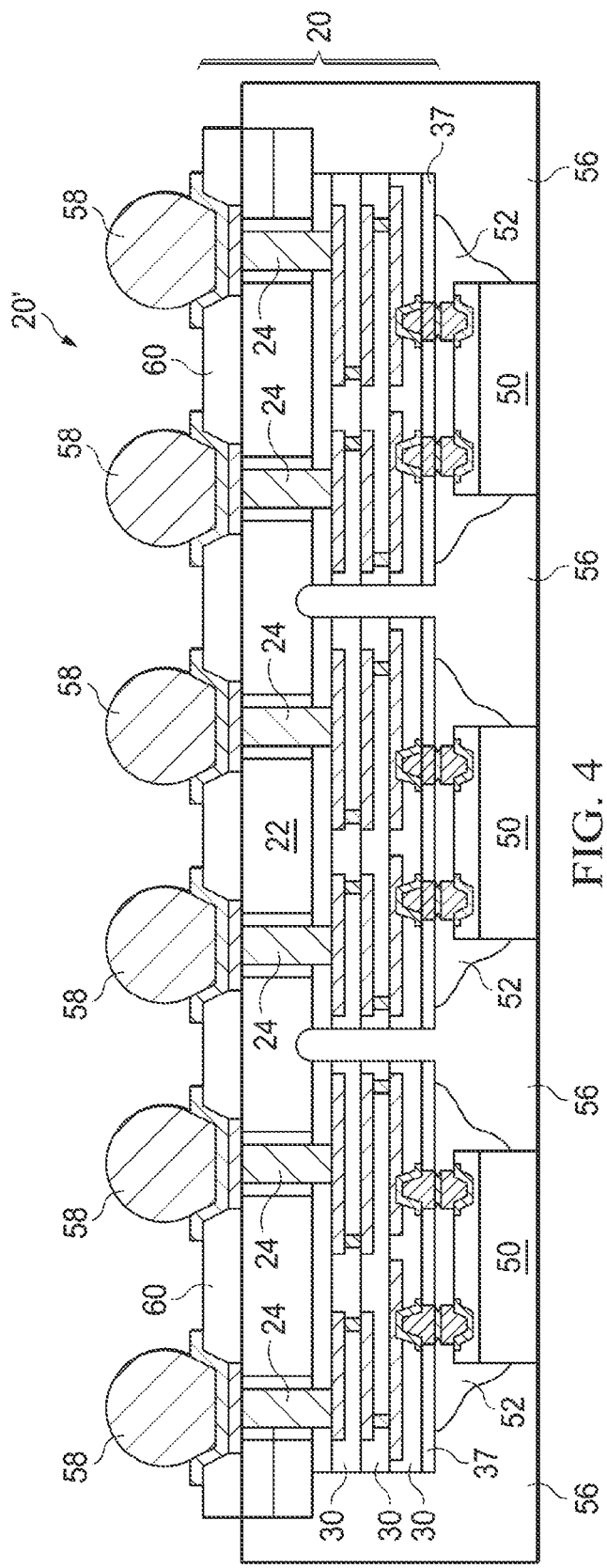

FIG. 4 illustrates the formation of the backside structure of wafer 20. The structure shown in FIG. 3 is flipped upside down, and semiconductor substrate 22 faces upwardly. A backside grinding is performed on the backside of semiconductor substrate 22 to thin semiconductor substrate 22, until TSVs 24 are exposed. Dielectric layer(s) 60 are formed on the backside of semiconductor substrate 22. Bumps 58 are also formed on the backside of wafer 20 and electrically coupled to TSVs 24. In an embodiment, bumps 58 are solder bumps. Redistribution lines (RDLs, not shown) may be optionally formed on the backside of wafer 20 and in dielectric layers 60, wherein the formation process may be similar to the formation of the metal lines and vias in dielectric layers 30. Bumps 58 may be used to bond to an additional electrical component (not shown), which may be a package substrate, a printed circuit board (PCB), or the like. Throughout the description, the structure shown in FIG. 4 is referred to as wafer 20', which includes wafer 20, dies 50, and polymer 56.

Figure 5A:
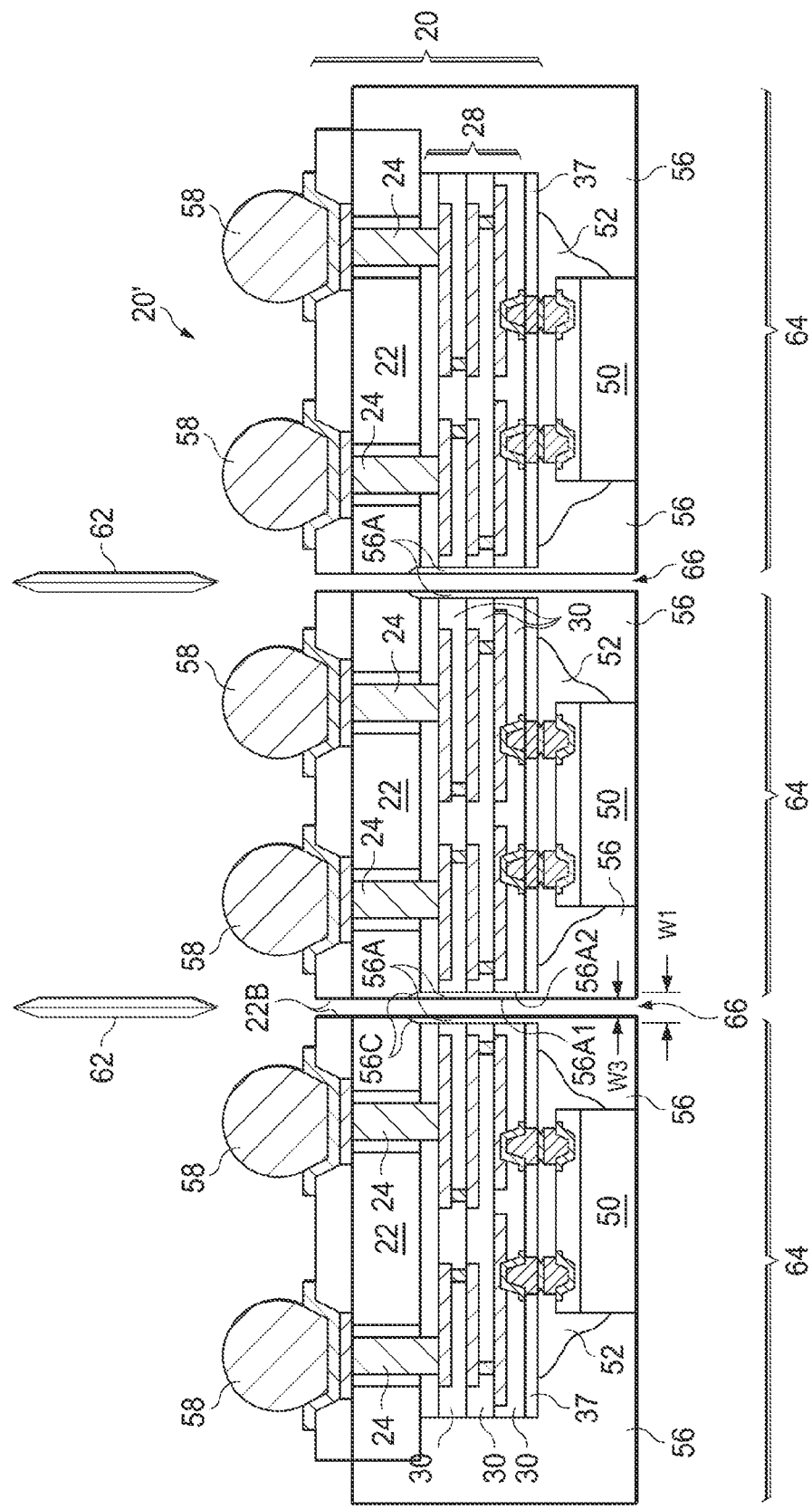

FIG. 5A illustrates the die-saw of wafer 20' to form dies 64. In an embodiment, the die-saw is performed using blade 62. The width of blade 62, and width W3 of the kerf lines 66 generated by blade 62, may be smaller than widths W1 of trenches 44 (refer to in FIG. 1A). Also, in an embodiment, kerf lines 66 may be aligned to the centers of trenches 44, and hence the portions of polymer 56 that are filled into trenches 44 have portions 56A remaining on both sides of kerf lines 66.

In each of resulting dies 64, the outer edges 56A1 of polymer portion 56A are co-terminus with edges 22B of semiconductor substrate 22. Alternatively stating, the outer edges 56A1 of polymer 56 are aligned to the respective outer edges 22B of semiconductor substrate 22, and edges 56A1 and the respective edges 22B form continuous straight edges. Polymer 56 also includes inner edges 56A2 that are in physical contact with low-k dielectric layers 30. The ends 56C of polymer 56 may also contact semiconductor substrate 22. FIG. 5B illustrates a bottom view of die 64 in FIG. 5B, which illustrates that portion 56A of polymer 56 forms a ring encircling low-k dielectric layers 30, and that edges 56A1 of polymer 56 are co-terminus with the respective edges 22B of semiconductor substrate 22.

In the formation of 3DIC packages in accordance with the above-illustrated embodiments, low-k dielectric layers are first grooved, and the resulting trenches are filled with a polymer. In the subsequent die-saw process, a blade cuts through the polymer that is filled into the trenches, instead of cutting through the low-k dielectric materials in the low-k dielectric layers. Accordingly, the likely cracking of the low-k dielectric layers resulted from the die-saw is at least reduced, and possibly eliminated. In addition, in the resulting dies 64 (FIGS. 5A and 5B), polymer 56 forms a continuous region that extend from the top of dies 50 to contact the edges of low-k dielectric materials. Accordingly, polymer 56 provides additional insulation to insulate low-k dielectric materials from being exposed to detrimental substances such as moisture. In addition, polymer 56 also provides extra mechanical support to the low-k dielectric materials.

An embodiment device includes a semiconductor chip, a die, and a polymer. The semiconductor chip includes a semiconductor substrate, wherein the semiconductor substrate comprises a first edge, and a low-k dielectric layer over the semiconductor substrate. The die is disposed over and bonded to the semiconductor chip. The polymer is molded onto the semiconductor chip and the die. The polymer includes a portion level with the low-k dielectric layer, wherein the portion of the polymer comprises a second edge vertically aligned to the first edge of the semiconductor substrate and a third edge contacting the low-k dielectric layer, wherein the second and the third edges are opposite edges of the portion of the polymer.

An embodiment device includes a semiconductor chip, a die, and a polymer. The semiconductor chip comprises a semiconductor substrate, wherein the semiconductor substrate comprises a first edge, and a low-k dielectric layer over the semiconductor substrate. The die is disposed over and bonded to the semiconductor chip. The polymer is molded onto the semiconductor chip and the die. The polymer occupies a portion of a trench extending along the low-k dielectric layer. A non-vertical portion of the polymer in the trench interfaces with the semiconductor substrate.

An embodiment device includes a semiconductor chip, a die, and a polymer. The semiconductor chip comprises a semiconductor substrate, wherein the semiconductor substrate comprises a first edge, and a low-k dielectric layer over the semiconductor substrate. The die is disposed over and bonded to the semiconductor chip. The polymer is molded onto the semiconductor chip and the die. The polymer comprises a portion level with the low-k dielectric layer. The portion of the polymer comprises a second edge vertically aligned to the first edge of the semiconductor substrate, a third edge contacting the low-k dielectric layer, wherein the second and the third edges are opposite edges of the portion of the polymer, and an arcuate terminal surface, the arcuate terminal surface including a non-vertical portion interfacing with the semiconductor substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor chip comprising:
   a semiconductor substrate, wherein the semiconductor substrate comprises a first edge; and
   a low-k dielectric layer over the semiconductor substrate;
a die over and bonded to the semiconductor chip; and
a polymer molded onto the semiconductor chip and the die, wherein the polymer comprises a portion laterally adjacent to the low-k dielectric layer, and wherein the portion of the polymer comprises:
   a second edge vertically aligned to the first edge of the semiconductor substrate;
   a third edge contacting the low-k dielectric layer, wherein the second and the third edges are opposite edges of the portion of the polymer; and
   a curved end surface interfacing with the semiconductor substrate.

2. The device of claim 1, wherein the portion of the polymer comprises an end in physical contact with the semiconductor substrate.

3. The device of claim 1, wherein an interface between the portion of the polymer and the semiconductor substrate is substantially even with a surface of the semiconductor substrate that is directly underlying the low-k dielectric layer.

4. The device of claim 1, wherein an interface between the portion of the polymer and the semiconductor substrate is lower than a surface of the semiconductor substrate that is directly underlying the low-k dielectric layer.

5. The device of claim 1, wherein the polymer has a top surface level with a top surface of the die.

6. The device of claim 1, wherein the polymer encircles and covers all low-k dielectric layers of the chip.

7. The device of claim 1, wherein the chip comprises:
a through-substrate via (TSV) penetrating through the semiconductor substrate; and
a solder ball electrically coupled to the TSV, wherein the solder ball and the polymer are on opposite sides of the semiconductor substrate.

8. The device of claim 1, wherein the curved end surface having a portion perpendicular to at least one of the second edge and the third edge.

9. A device comprising:
a semiconductor chip comprising:
   a semiconductor substrate, wherein the semiconductor substrate comprises a first edge; and
   a low-k dielectric layer over the semiconductor substrate;
a die over and bonded to the semiconductor chip; and
a polymer molded onto the semiconductor chip and the die, the polymer occupying a portion of a trench extending along the low-k dielectric layer, a non-vertical portion of the polymer in the trench interfacing with the semiconductor substrate.

10. The device of claim 9, wherein the polymer occupying the portion of the trench extends vertically along the low-k dielectric layer.

11. The device of claim 9, wherein the non-vertical portion of the polymer in the trench is embedded within the semiconductor substrate.

12. The device of claim 9, wherein the non-vertical portion of the polymer in the trench is beneath a surface of the semiconductor substrate engaging the low-k dielectric layer.

13. The device of claim 9, wherein the polymer encircles and covers all low-k dielectric layers of the chip.

14. The device of claim 9, wherein the chip includes a through-substrate via (TSV) penetrating through the semiconductor substrate, and wherein a solder ball is electrically coupled to the TSV.

15. A device comprising:
a semiconductor chip comprising:
   a semiconductor substrate, wherein the semiconductor substrate comprises a first edge; and
   a low-k dielectric layer over the semiconductor substrate;
a die over and bonded to the semiconductor chip; and
a polymer molded onto the semiconductor chip and the die, wherein the polymer comprises a portion laterally adjacent to the low-k dielectric layer, and wherein the portion of the polymer comprises:
   a second edge vertically aligned to the first edge of the semiconductor substrate;
   a third edge contacting the low-k dielectric layer, wherein the second and the third edges are opposite edges of the portion of the polymer; and
   a curved end surface, the curved end surface interfacing with the semiconductor substrate.

16. The device of claim 15, wherein the curved end surface includes a portion orthogonal to each of the second edge and the third edge.

17. The device of claim 15, wherein the portion of the polymer occupies a portion of a trench extending along the low-k dielectric layer.

18. The device of claim 17, wherein the trench is oriented perpendicular to the low-k dielectric layer.

19. The device of claim 15, wherein the curved end surface of the polymer is beneath a surface of the semiconductor substrate engaging the low-k dielectric layer.

20. The device of claim 15, wherein an entirety of the curved end surface of the polymer is direct contact with the semiconductor substrate.

21. A device comprising:
a semiconductor chip including a low-k dielectric layer disposed over a semiconductor substrate, the semiconductor substrate including a first edge;
a die over and bonded to the semiconductor chip; and
a polymer molded onto the semiconductor chip and the die, a portion of the polymer extending vertically along the low-k dielectric layer and including a curved end surface interfacing with the semiconductor substrate.

22. The device of claim 21, wherein the portion of the polymer includes second and third edges opposite edges of the portion of the polymer, the second edge vertically aligned to the first edge of the semiconductor substrate, the third edge contacting the low-k dielectric layer.

23. The device of claim 22, wherein a portion of the curved end surface is orthogonal to each of the second edge and the third edge.

* * * * *